US010840328B1

(12) United States Patent
Chang et al.

(10) Patent No.: US 10,840,328 B1
(45) Date of Patent: Nov. 17, 2020

(54) SEMICONDUCTOR DEVICES HAVING CHARGE-ABSORBING STRUCTURE DISPOSED OVER SUBSTRATE AND METHODS FOR FORMING THE SEMICONDUCTOR DEVICES

(71) Applicant: Vanguard International Semiconductor Corporation, Hsinchu (TW)

(72) Inventors: Jui-Chun Chang, Hsinchu (TW); Bo-Yuan Su, Tainan (TW); Chien-Nan Liao, Taichung (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 16/413,871

(22) Filed: May 16, 2019

(51) Int. Cl.
| | |
|---|---|
| H01L 29/06 | (2006.01) |
| H01L 21/266 | (2006.01) |
| H01L 29/66 | (2006.01) |
| H01L 29/78 | (2006.01) |

(52) U.S. Cl.
CPC ........ *H01L 29/0634* (2013.01); *H01L 21/266* (2013.01); *H01L 29/0649* (2013.01); *H01L 29/66477* (2013.01); *H01L 29/78* (2013.01)

(58) Field of Classification Search
CPC ........... H01L 29/0634; H01L 29/66659; H01L 29/7835; H01L 29/78624; H01L 29/78; H01L 29/0649; H01L 29/66477; H01L 21/2253; H01L 21/266;
(Continued)

(56) References Cited

U.S. PATENT DOCUMENTS 6,133,613 A    10/2000 Yao et al.
6,335,267 B1 *  1/2002 Iwamatsu ........... H01L 27/1203
                                                    438/479
(Continued)

FOREIGN PATENT DOCUMENTS

TW         201535738 A     9/2015

OTHER PUBLICATIONS

Taiwanese Office Action and Search Report for Taiwanese Application No. 108106028, dated Aug. 13, 2019.

*Primary Examiner* — Khiem D Nguyen
(74) *Attorney, Agent, or Firm* — Birch, Stewart, Kolasch & Birch, LLP

(57) ABSTRACT

A semiconductor device includes a charge-absorbing structure disposed over a substrate; an insulating layer disposed over the charge-absorbing structure; a semiconductor layer disposed over the insulating layer; a plurality of first doped regions and a plurality of second doped regions disposed in the semiconductor layer, wherein the first doped regions and second doped regions extend in a first direction and are alternately arranged along a second direction that is different than the first direction, and the plurality of first doped regions and the plurality of second doped regions have different conductivity types; a source and a drain disposed respectively on opposite sides of the plurality of first doped regions and the plurality of second doped regions and extend in the second direction; and a gate disposed on the plurality of first doped regions and the plurality of second doped regions and extends in the second direction.

18 Claims, 6 Drawing Sheets

(58) Field of Classification Search
CPC ..... H01L 29/063–0634; H01L 29/7802; H01L 29/7813; H01L 29/66712
See application file for complete search history.

(56) References Cited

U.S. PATENT DOCUMENTS

| | | | |
|---|---|---|---|
| 7,868,419 B1* | 1/2011 | Kerr | H01L 23/645 257/499 |
| 2004/0002197 A1* | 1/2004 | Fathimulla | H01L 21/76254 438/455 |
| 2004/0108537 A1* | 6/2004 | Tiwari | H01L 29/40114 257/314 |
| 2011/0298083 A1* | 12/2011 | Yoneda | H01L 21/84 257/506 |
| 2012/0292689 A1* | 11/2012 | Wu | H01L 29/7397 257/330 |
| 2015/0295026 A1* | 10/2015 | Chang | H01L 29/0688 257/341 |
| 2018/0114720 A1* | 4/2018 | Wang | H01L 21/0245 |

\* cited by examiner

US 10,840,328 B1

SEMICONDUCTOR DEVICES HAVING CHARGE-ABSORBING STRUCTURE DISPOSED OVER SUBSTRATE AND METHODS FOR FORMING THE SEMICONDUCTOR DEVICES

BACKGROUND

Technical Field

The embodiments of the present disclosure relate to semiconductor manufacturing, and in particular to a semiconductor device having a super junction structure and a method for forming the same.

Description of the Related Art

A semiconductor device includes a substrate and a circuit component disposed over the substrate. Semiconductor devices are widely used in various electronic applications, such as personal computers, mobile phones, digital cameras, and other electronic equipment. These continuously evolving semiconductor devices continue to influence and improve the way people live.

Since a metal-oxide-semiconductor field-effect transistor (MOSFET) has a high switching speed, high input impedance, low driving power, excellent high-frequency characteristics, and a large, safe operating area, as well as other advantages, the range of applications is becoming wider, especially as manufacturing technologies are becoming more mature.

Subsequently, a MOSFET having a super junction structure, such as a vertically diffused metal oxide semiconductor (VDMOS) device, has been developed, which changes the physical limitations of the depletion region and the withstand voltage of a conventional MOSFET, and achieves the advantages of reducing on-resistance (Ron). However, for vertical diffusion metal oxide semiconductor devices, vertical channel design and process complexity also limit their application.

BRIEF SUMMARY

In accordance with some embodiments of the present disclosure, a semiconductor device is provided. The semiconductor device includes a charge-absorbing structure disposed over a substrate; an insulating layer disposed over the charge-absorbing structure; a semiconductor layer disposed over the insulating layer; a plurality of first doped regions and a plurality of second doped regions disposed in the semiconductor layer, wherein the first doped regions and second doped regions extend in a first direction and are alternately arranged along a second direction that is different than the first direction, and the plurality of first doped regions and the plurality of second doped regions have different conductivity types; a source and a drain disposed respectively on opposite sides of the plurality of first doped regions and the plurality of second doped regions which are alternately arranged and the source and the drain extend in the second direction; and a gate disposed on the plurality of first doped regions and the plurality of second doped regions which are alternately arranged and the gate extends in the second direction.

In some embodiments, the charge-absorbing structure includes polycrystalline silicon.

In some embodiments, the thickness of the charge-absorbing structure is in a range from 100 nm to 1000 nm.

In some embodiments, the semiconductor device further includes a buffer layer encapsulating the entire substrate.

In some embodiments, the buffer layer includes an oxide, a nitride, or a combination thereof.

In some embodiments, the charge-absorbing structure encapsulates the entire substrate and the buffer layer encapsulates the charge-absorbing structure.

In some embodiments, the charge-absorbing structure encapsulates the entire substrate and the buffer layer is located between the substrate and the charge-absorbing structure.

In some embodiments, the semiconductor device further includes an additional buffer layer encapsulating the charge-absorbing structure.

In some embodiments, the semiconductor device further includes a pair of additional charge-absorbing structures passing through the insulating layer to contact the charge-absorbing structure.

In some embodiments, the width of each additional charge-absorbing structure is in a range from 0.5 µm to 2 µm.

In accordance with another embodiments of the present disclosure, a method of forming a semiconductor device is provided. The method includes forming a charge-absorbing structure on a substrate; forming an insulating layer over the charge-absorbing structure and a semiconductor layer over the insulating layer; forming a mask layer having a plurality of openings over the semiconductor layer; implanting a portion of the semiconductor layer through the plurality of openings to form a plurality of first doped regions having a first conductivity type, wherein the first doped regions extend in a first direction; forming a plurality of field oxides through the plurality of openings to respectively cover the plurality of first doped regions; after forming the plurality of field oxides, removing the mask layer; implanting another portion of the semiconductor layer with the plurality of field oxides as masks to form a plurality of second doped regions having a second conductivity type that is different than the first conductivity type, wherein the second doped regions extend in the first direction and are alternately arranged with the first doped region along the second direction that is different than the first direction; and after forming the plurality of second doped regions, removing the plurality of field oxides.

In some embodiments, the material of the plurality of field oxides is different than the material of the mask layer.

In some embodiments, the ratio of the thickness of the mask layer to the thickness of one of the field oxides is in a range from 5:1 to 10:1.

In some embodiments, the method further includes forming a source and a drain along the second direction on both sides of the first doped regions and the second doped regions which are alternately arranged, respectively; and forming a gate on the semiconductor layer and along the second direction.

In some embodiments, the method further includes forming a buffer layer which encapsulates the entire substrate.

In some embodiments, forming the buffer layer includes depositing an oxide, a nitride, or a combination thereof.

In some embodiments, the charge-absorbing structure encapsulates the entire substrate and the buffer layer encapsulates the entire charge-absorbing structure.

In some embodiments, the charge-absorbing structure encapsulates the entire substrate, and a buffer layer is located between the charge-absorbing structure and the substrate.

In some embodiments, the method further includes forming an additional buffer layer which encapsulates the entire charge-absorbing structure.

In some embodiments, the method further includes forming a pair of additional charge-absorbing structures which pass through the insulating layer to contact the charge-absorbing structure.

BRIEF DESCRIPTION OF THE DRAWINGS

The disclosure can be more fully understood from the following detailed description when read with the accompanying figures. It is worth noting that, in accordance with standard practice in the industry, various features are not drawn to scale and are for illustrative purposes only. In fact, the dimensions of the various features may be arbitrarily increased or reduced for clarity of the features of the present disclosure.

DETAILED DESCRIPTION

The following outlines several embodiments so that those skilled in the art may better understand the present disclosure. However, these embodiments are examples only and are not intended to limit the present disclosure. It is understandable that those skilled in the art may adjust the embodiments described below according to requirements, for example, changing the sequences of processes and/or including more or fewer steps than described herein.

Furthermore, other elements may be added on the basis of the embodiments described below. For example, the description of "forming a second element on a first element" may include embodiments in which the first element is in direct contact with the second element, and may also include embodiments in which additional elements are disposed between the first element and the second element such that the first element and the second element are not in direct contact, and spatially relative descriptors of the first element and the second element may change as the device is operated or used in different orientations.

Hereinafter, a semiconductor device and a method of forming the same will be described in accordance with some embodiments of the present disclosure, and are particularly applicable to a semiconductor device having a semiconductor-on-insulator (SOI) substrate. The present disclosure provides a novel method of forming a super junction structure that accurately controls ion implanted regions such that a semiconductor device having an insulator-on-insulator semiconductor substrate has a new super junction structure to reduce channel length and improve the breakdown voltage and on-resistance. Furthermore, the present disclosure provides a charge-absorbing structure, which can reduce a parasitic effect of a SOI substrate.

Figure 1A:
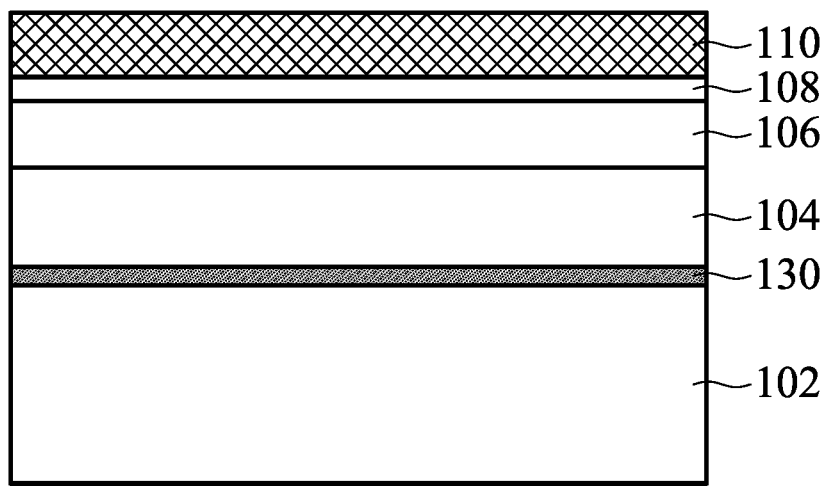
FIGS. 1A-1E are cross-sectional views illustrating a semiconductor device at various stages of manufacture in accordance with some embodiments.

FIGS. 1A-1E are cross-sectional views illustrating various stages of forming a semiconductor device 100 in accordance with some embodiments. As illustrated in FIG. 1A, the semiconductor device 100 includes a substrate 102. The substrate 102 may include any substrate material suitable for the semiconductor device 100. For example, the substrate 102 may be a bulk semiconductor substrate or a composite substrate formed of different materials, and the substrate 102 may be doped (for example, by p-type or n-type dopants) or undoped. In some embodiments, the substrate 102 may include an elemental semiconductor substrate, a compound semiconductor substrate, or an alloy semiconductor substrate. For example, the substrate 102 may include a silicon substrate, a germanium substrate, a silicon germanium substrate, a silicon carbide substrate, an aluminum nitride substrate, an aluminum oxide substrate, a gallium nitride substrate, the like, or a combination thereof.

Then, a charge-absorbing structure 130 is disposed over the substrate 102 in accordance with some embodiments. The charge-absorbing structure 130 in the semiconductor device 100 can reduce parasitic effects at high frequency operation, and thus is particularly suitable for the semiconductor device 100 having an SOI substrate which operates at a high voltage (for example, higher than 30 volts).

In some embodiments, the charge-absorbing structure 130 may include polysilicon, and the thickness of the charge-absorbing structure 130 may be in a range from about 100 nanometers (nm) to about 1000 nm, such as about 300 nm to about 500 nm. In some embodiments, the charge-absorbing structure 130 may be formed by a deposition process, such as a low pressure chemical vapor deposition (LPCVD) process or other suitable deposition process.

Then, an insulating layer 104 is disposed over the charge-absorbing structure 130 and a semiconductor layer 106 is disposed over the insulating layer 104, in accordance with some embodiments. In some embodiments, the insulating layer 104 may include a buried dielectric layer, such as buried oxide (BOX), buried silicon oxide ($SiO_2$), buried silicon nitride (SiN), the like, or a combination thereof. In some embodiments, the thickness of the insulating layer 104 may be in a range from about 3 microns ($\mu$m) to about 10 $\mu$m, such as from about 4 $\mu$m to about 6 $\mu$m.

In some embodiments, the semiconductor layer 106 may include silicon, and the thickness of the semiconductor layer 106 may be in a range from about 0.5 $\mu$m to about 4 $\mu$m, such as from about 1 $\mu$m to about 1.5 $\mu$m.

In some embodiments, the insulating layer 104 and the semiconductor layer 106 may be formed by a wafer bonding process, an epitaxial layer transfer (ELTRAN) process, the like, or a combination thereof.

In embodiments using a wafer bonding process, the insulating layer 104 is directly bonded to the semiconductor layer 106, and then both are bonded to the substrate 102 on which the charge-absorbing structure 130 has been formed. The semiconductor layer 106 may be thinned before being bonded to the substrate 102.

In embodiments using an ELTRAN process, the semiconductor layer 106 is epitaxially grown on a seed layer (not illustrated), and the semiconductor layer 106 is oxidized to form the insulating layer 104. After the insulating layer 104 is bonded to the substrate 102 on which the charge-absorbing structure 130 has been formed, the seed layer is removed.

Then, a sacrificial layer 108 is formed over the semiconductor layer 106 in accordance with some embodiments. The sacrificial layer 108 can prevent a surface of the semiconductor layer 106 from being contaminated, and can reduce the damage caused by the subsequent ion implantation process on the semiconductor layer 106, and also help control the depth of dopants into the semiconductor layer 106. In some embodiments, the sacrificial layer 108 may be formed by a thermal oxide process or other suitable process, and the sacrificial layer 108 may include an oxide, such as silicon oxide. In some embodiments, the thickness of the sacrificial layer 108 may be in a range from about 10 angstroms (Å) to about 300 Å, such as from about 150 Å to about 200 Å. Within this thickness range, the sacrificial layer 108 can protect the surface of the semiconductor layer 106 without interfering with subsequent ion implantation processes.

Then, a mask layer 110 is formed over the sacrificial layer 108, in accordance with some embodiments. In some embodiments, the mask layer 110 may include a hard mask such as silicon oxide, silicon nitride, silicon oxynitride, silicon carbide, silicon carbonitride, the like, or a combination thereof. In some embodiments, the mask layer 110 may be formed by a deposition process, such as a chemical vapor deposition (CVD) process, a silicon on glass (SOG) process, an atomic layer deposition (ALD) process, a combination thereof, or any suitable deposition process.

Figure 1B:
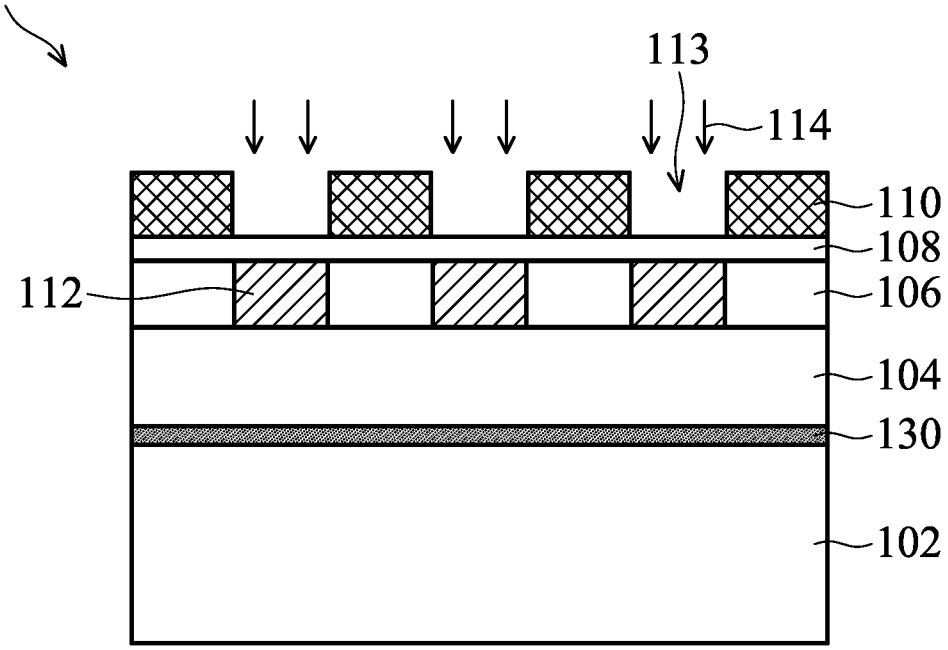

Then, the mask layer 110 is patterned to form a plurality of openings 113 exposing the underlying layers, wherein the openings 113 correspond to subsequent doped regions, as illustrated in FIG. 1B, in accordance with some embodiments. In some embodiments, each opening 113 has a width that may be in a range from about 0.1 µm to about 1 µm, such as from about 0.4 µm to about 0.6 µm. In some embodiments, the distance between the openings 113 may be in a range from about 0.1 µm to about 1 µm, such as from about 0.4 µm to about 0.6 µm.

Then, a first implant process 114 is performed on the semiconductor layer 106 through the openings 113 to form a plurality of first doped regions 112 in a portion of the semiconductor layer 106, wherein the first doped regions 112 have a first conductivity type. In some embodiments, the first implant process 114 may be performed using a p-type dopant or an n-type dopant. For example, the p-type dopant may be boron, aluminum, gallium, $BF_2$, the like, or a combination thereof, and the n-type dopant may be nitrogen, phosphorus, arsenic, antimony, the like, or a combination thereof. In some embodiments, the first implant process 114 has an ion implantation concentration in the range from about $1 \times 10^{14}$ $cm^{-2}$ to about $1 \times 10^{17}$ $cm^{-2}$, such as from about $5 \times 10^{15}$ $cm^{-2}$ to about $1 \times 10^{16}$ $cm^{-2}$.

Figure 1C:
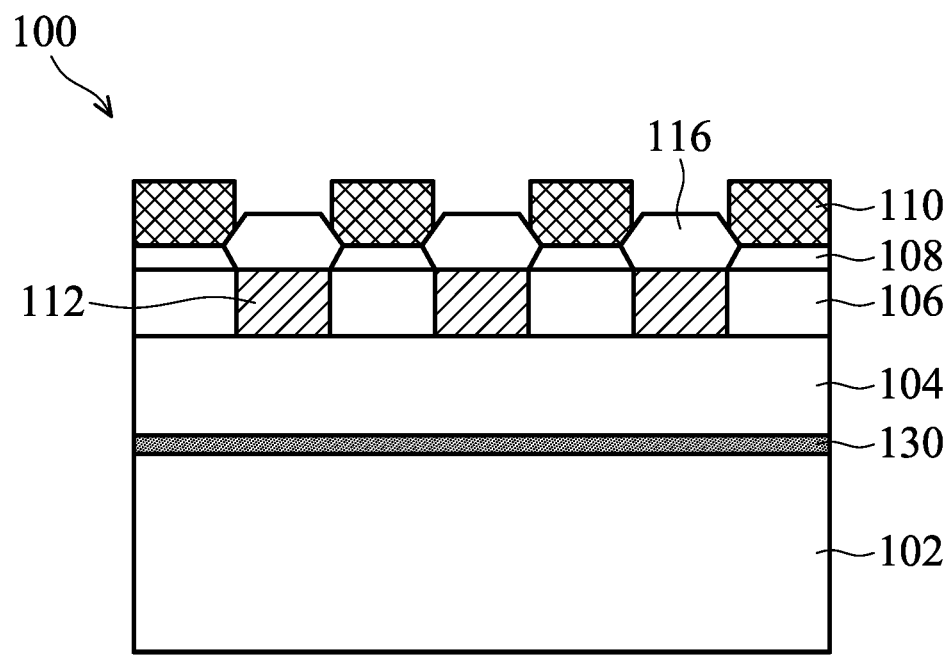

Then, a plurality of field oxides 116 are formed in the exposed portions of the sacrificial layer 108 through the openings 113 of the mask layer 110, as illustrated in FIG. 1C, in accordance with some embodiments. In some embodiments, the plurality of field oxides 116 may be formed by oxidizing a portion of the semiconductor layer 106 by a thermal oxidation process or other suitable process. One of the field oxide 116 may have a thickness in a range from about 100 Å to about 500 Å, such as from about 300 Å to about 400 Å. Within this thickness range, the dopants that are subsequently subjected to ion implantation can be blocked from entering the first doped region 112 under the plurality of field oxides 116 without consuming too much volume of the semiconductor layer 106 for accurately controlling the range of subsequent ion implantation.

According to some embodiments, the ratio of the thickness of the mask layer 110 to the thickness of one of the field oxides 116 is in a range from about 5:1 to about 10:1, such as from about 7:1 to about 8:1. Forming the field oxide 116 may result in a bird's beak structure at the edge of the field oxide 116, and within this thickness ratio range, the stress forming the field oxide 116 can be reduced, and the area forming the bird's beak structure can be reduced, and the uniformity of ion implantation concentration can be improved.

Figure 1D:
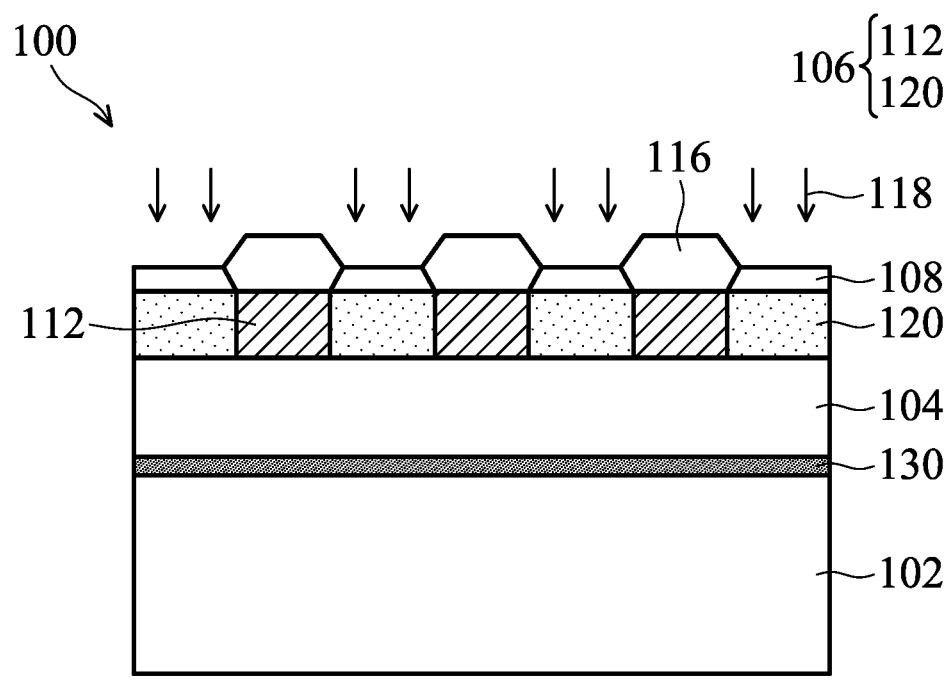

Then, the mask layer 110 is removed, as illustrated in FIG. 1D, in accordance with some embodiments. A second implant process 118 is then performed on the semiconductor layer 106 to form a plurality of second doped regions 120 in a portion of the semiconductor layer 106, wherein the second doped regions 120 have a second conductivity type that is different than the first conductivity type. In some embodiments, the first doped region 112 is p-type and the second doped region 120 is n-type. In other embodiments, the first doped region 112 is n-type and the second doped region 120 is p-type. The second implantation process 118 may use the p-type dopants or n-type dopants and the implant concentrations as described above with respect to the first implantation process 114, and thus will not be described again.

As previously discussed, the field oxide 116 can protect the first doped region 112 during the second implant process 118, avoiding the dopants of the second implant process 118 implanting into the first doped region 112. Therefore, the first doped regions 112 and the second doped regions 120 which are alternately arranged may be formed, and a sidewall of the plurality of second doped regions 120 are substantially aligned with a sidewall of the plurality of field oxides 116.

Figure 1E:
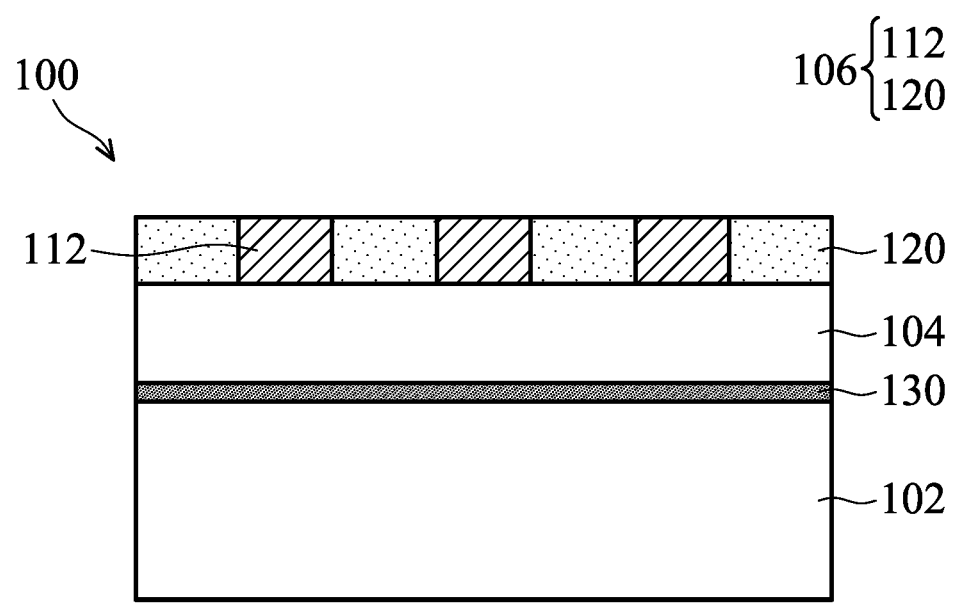

Then, the sacrificial layer 108 and the field oxide 116 are removed to expose the first doped region 112 and the second doped region 120, as illustrated in FIG. 1E, in accordance with some embodiments. In some embodiments, the sacrificial layer 108 and the field oxide 116 may be removed using an etching process, such as a wet etch process, using, for example, hydrofluoric acid (HF) or any suitable etchant.

By using the mask layer 110 and the field oxide 116 in conjunction with the first implant process 114 and the second implant process 118, the ion implant region can be precisely controlled to form the first doped regions 112 and the second doped regions 120 which are self-aligned to avoid an offset region due to photolithography shift, and to form the first doped regions 112 and the second doped regions 120 which are alternately arranged in the semiconductor device 100.

In addition, due to the accuracy achievable by the method of the present disclosure, the breakdown voltage and the on-resistance of the semiconductor device 100 can be optimized while reducing the channel length of the semiconductor device 100, so that the semiconductor device 100 can be more widely used, and is beneficial for integration with a radio frequency (RF) integrated circuit (IC).

Figure 2:
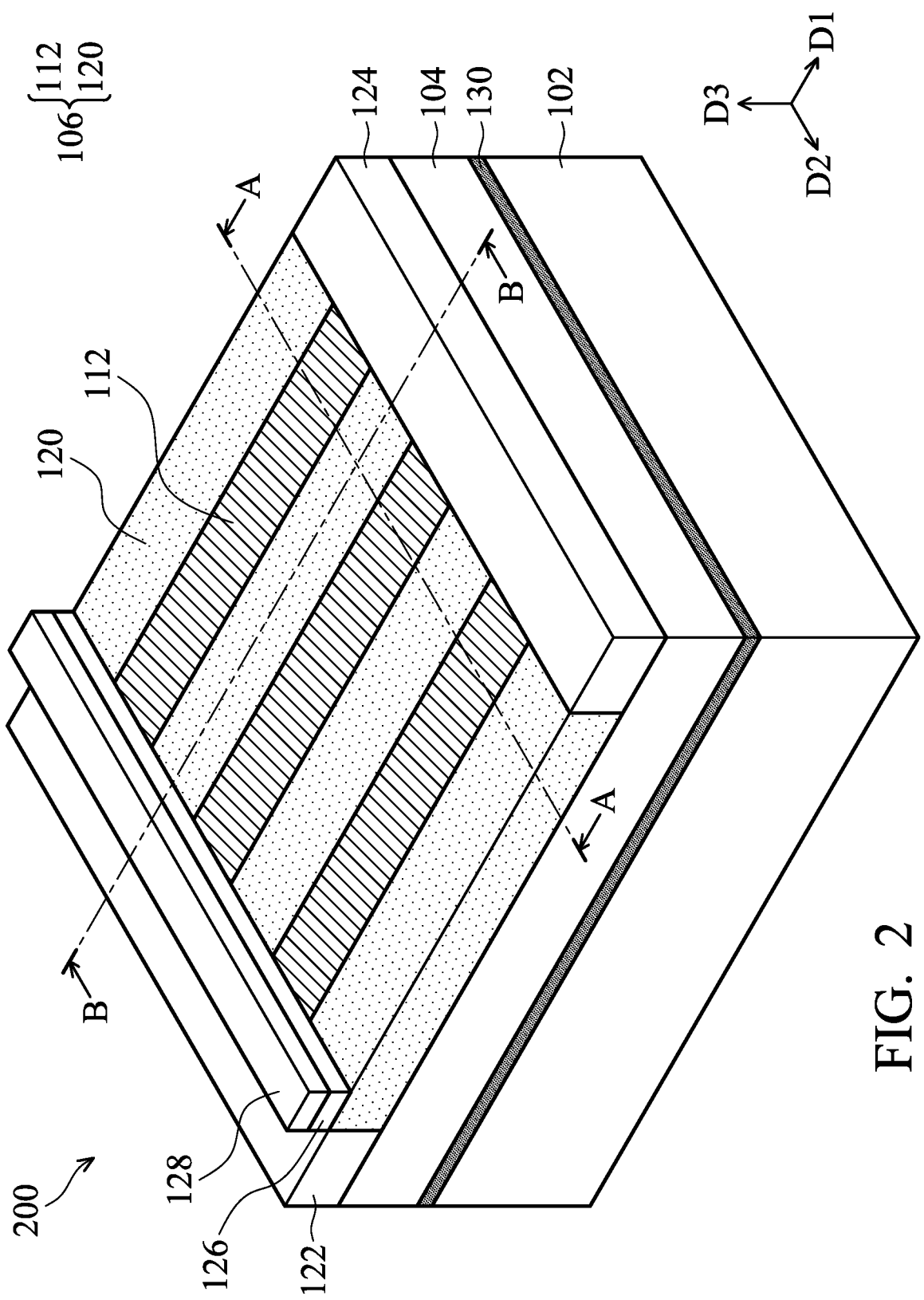
FIG. 2 is a perspective view illustrating a semiconductor device in accordance with some embodiments.

FIG. 2 is a perspective schematic view of a semiconductor device 200 in accordance with some embodiments. FIGS. 1A-1E are cross-sectional views of the semiconductor device 100 taken along line A-A of FIG. 2. FIG. 2 and FIGS. 1A-1E illustrate same elements with same symbols, and the formation and materials of these elements are as described above, and thus will not be described again.

As illustrated in FIG. 2, line B-B extends in a first direction D1, and line A-A extends in a second direction D2 different form the first direction D1. As illustrated in FIG. 2, the first doped region 112 and the second doped region 120 extend in the first direction D1 and are alternately arranged along the second direction D2. The charge-absorbing structure 130, the insulating layer 104, and the semiconductor layer 106 are stacked along a third direction D3. In some embodiments, the first direction D1, the second direction D2, and the third direction D3 are substantially perpendicular to each other. In some embodiments, angles between the first direction D1, the second direction D2, and the third direction D3 are each independently in a range from about 80° to about 95°, for example, an angle between the first direction D1 and the second direction D2 is in a range from about 85° to about 90°.

According to some embodiments, a source 122, a drain 124, and a gate are disposed in the semiconductor device 200, wherein the gate includes a gate dielectric 126 and a gate electrode 128 over the gate dielectric 126, as illustrated in FIG. 2. The source 122 and the drain 124 are respectively disposed on both sides of the first doped region 112 and the second doped region 120 which are alternately arranged and extend in the second direction D2. The gate dielectric 126 and the gate electrode 128 are disposed on the first doped region 112 and second doped region 120 which are alternately arranged and extend in the second direction D2.

In some embodiments, the source 122 and the drain 124 may be formed using an ion implantation process with a mask layer (not illustrated). In some embodiments, the mask layer may be a photoresist such as a positive photoresist or a negative photoresist. In other embodiments, the mask layer may be a hard mask such as silicon oxide, silicon nitride, silicon oxynitride, silicon carbide, silicon carbonitride, the like, or a combination thereof. In some embodiments, the mask layer may formed by spin-on coating, CVD, ALD, the like, or a combination thereof, and the mask layer may be patterned by suitable photolithography technology.

The source 122 and the drain 124 have the same conductivity type. In embodiments where the MOS device is p-type (PMOS), the source 122 and the drain 124 are p-type. In embodiments where the MOS device is an n-type (NMOS), the source 122 and the drain 124 are n-type. In some embodiments, the source 122 and the drain 124 may be formed simultaneously by an ion implantation process. In other embodiments, the source 122 and the drain 124 may be formed separately by different ion implantation processes.

The doping concentration of the source 122 and the drain 124 may be greater than or equal to the doping concentration of the first doped region 112 and the second doped region 120. In some embodiments, the source 122 and the drain 124 may each independently have a doping concentration of about $1\times10^{14}$ $cm^{-3}$ to about $5\times10^{17}$ $cm^{-3}$. The source 122 and the drain 124 may be doped by the ion implantation of the first doped region 112 or the second doped region 120.

In some embodiments, the gate dielectric 126 may include an oxide, such as silicon oxide. In some embodiments, the gate dielectric 126 may include a high-k dielectric material, that is, a dielectric material having a dielectric constant greater than 3.9. For example, the gate dielectric 126 may include $HfO_2$, $LaO_2$, $TiO_2$, $ZrO_2$, $Al_2O_3$, $Ta_2O_3$, HfZrO, $ZrSiO_2$, $HfSiO_4$, the like, or a combination thereof. The gate dielectric 126 may be formed by thermal oxidation, CVD, ALD, the like, or a combination thereof.

Then, the gate electrode 128 is formed over the gate dielectric 126. In some embodiments, the gate electrode 128 may be formed by physical vapor deposition (PVD), CVD, ALD, molecular beam epitaxy (MBE), liquid phase epitaxy (LPE), vapor phase epitaxy (VPE), the like, or a combination thereof. In some embodiments, the gate electrode 128 may include a conductive material such as a metal, a metal nitride, a metal oxide, a metal silicide, a semiconductor material, the like, or a combination thereof. For example, the metal may be gold (Au), nickel (Ni), platinum (Pt), palladium (Pd), iridium (Ir), titanium (Ti), chromium (Cr), tungsten (W), aluminum (Al), copper (Cu) the like, an alloy thereof, a multilayer thereof, or a combination thereof, and the semiconductor material may include poly-Si, poly-Ge, poly-SiGe, the like, or a combination thereof.

Although the order in which the source 122, the drain 124, the gate dielectric 126, and the gate electrode 128 are formed as described above, the present disclosure is not limited thereto, and these elements may be formed in other order of formation. In addition, the source 122, the drain 124, the gate dielectric 126, and the gate electrode 128 may be formed after the first doped region 112 and the second doped region 120 are formed, but the present disclosure is not limited thereto, and these elements may use other order of formation.

In addition, shapes of the source 122, the drain 124, the gate dielectric 126, and the gate electrode 128 are not limited to the vertical sidewalls as illustrated in the figures, and may be inclined sidewalls or sidewalls having other shape. In addition, as illustrated in FIG. 2, the sidewalls of the gate dielectric 126 and the sidewalls of the gate electrode 128 are substantially coplanar, and these sidewalls are substantially coplanar with the sidewalls of the source 122, but the present disclosure is not limited thereto. For example, the sidewall of the source 122 may be located between the sidewalls of the gate dielectric 126.

The substrate 102 and the charge-absorbing structure 130 of the present disclosure may also have other configurations to enhance the reliability of the semiconductor device. Other example configurations of substrate 102 and charge-absorbing structure 130 are described below in accordance with some embodiments. For simplicity, the same elements will be described by the same symbols, and the formation and materials of these elements are described above, and therefore will not be described again.

Figure 3:
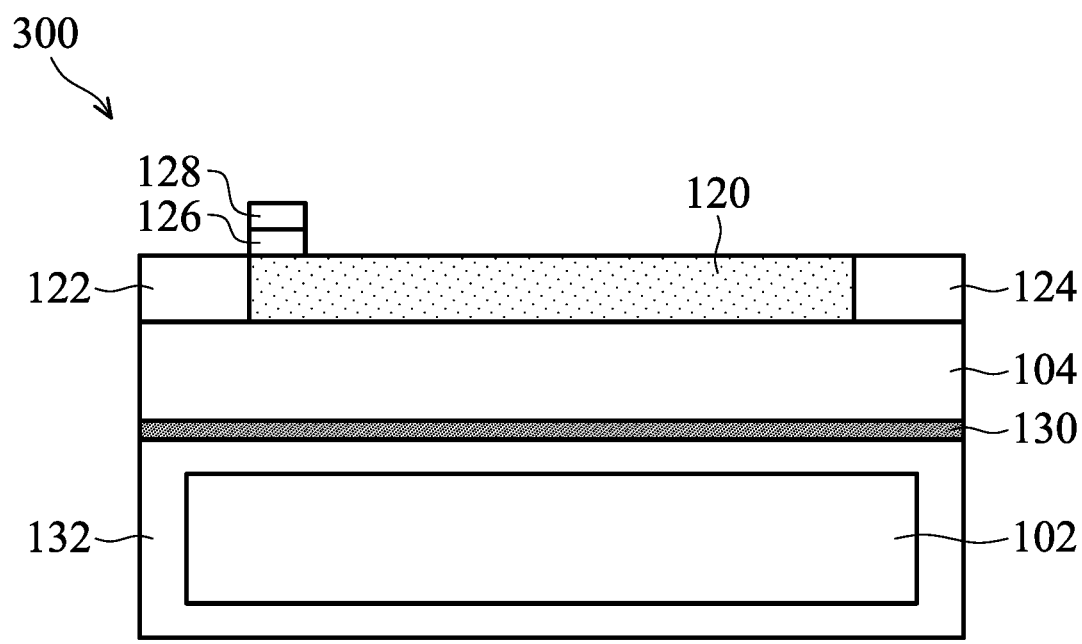
FIG. 3 is a cross-sectional view illustrating a semiconductor device at various stages of manufacture in accordance with some embodiments.
Figure 4:
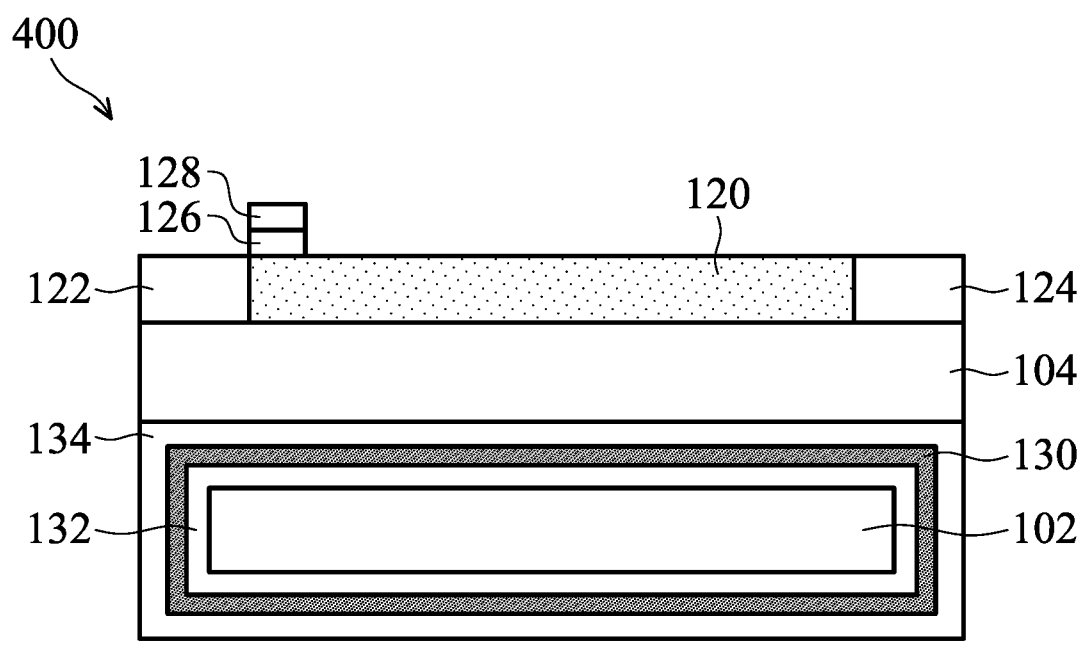
FIG. 4 is a cross-sectional view illustrating a semiconductor device at various stages of manufacture in accordance with some embodiments.
Figure 5:
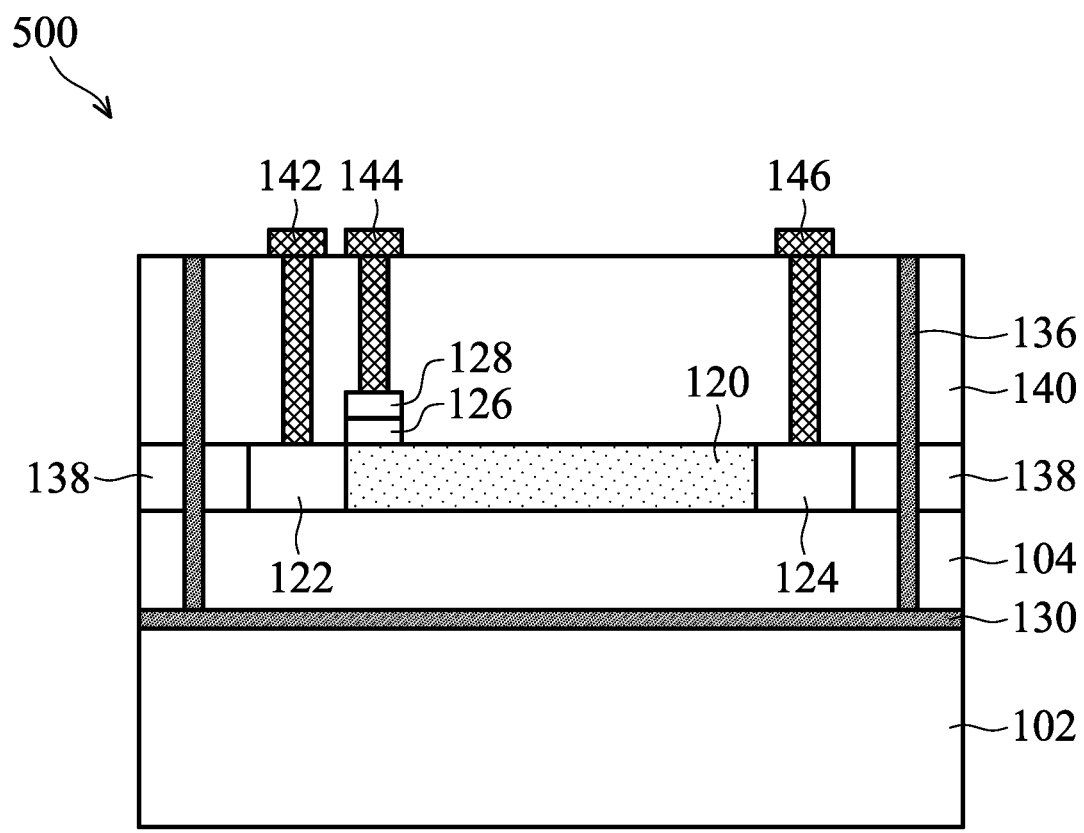
FIG. 5 is a cross-sectional view illustrating a semiconductor device at various stages of manufacture in accordance with some embodiments.

FIGS. 3-5 are cross-sectional views illustrating semiconductor devices 300, 400, and 500 in accordance with some embodiments. FIGS. 3-5 are cross-sectional views of the semiconductor devices 300, 400, and 500 taken along line B-B of FIG. 2.

According to some embodiments, the substrate 102 of the semiconductor device 300 includes a buffer layer 132 which encapsulates the entire substrate 102, as illustrated in FIG. 3. According to some embodiments, the buffer layer 132 disposed in the semiconductor device 300 can relieve the lattice mismatch between the substrate 102 and other layers to avoid stress-induced defects caused by the lattice mismatch. For example, the buffer layer 132 can relieve the lattice mismatch between the substrate 102 and the charge-absorbing structure 130. In addition, the buffer layer 132 can also repair defects on the surface of the substrate 102, for example, the buffer layer 132 can fill hole on the surface of the substrate 102, to enhance the crystalline quality of the surface of the substrate 102.

In some embodiments, the buffer layer 132 includes an oxide, a nitride, the like, or a combination thereof. For example, the buffer layer 132 may include silicon oxide. According to some embodiments, the buffer layer 132 may be formed by a deposition process, such as a LPCVD process, prior to forming the charge-absorbing structure 130. In some embodiments, the buffer layer 132 may have a thickness in a range from about 500 Å to about 2000 Å, such as from about 1000 Å to about 1200 Å. Under this thickness range, the buffer layer 132 can relieve the lattice mismatch between different layers, improve the crystal quality, and would not cause defects due to the stress caused by its own thickness.

According to some embodiments, the charge-absorbing structure 130 of the semiconductor device 400 encapsulates the entire substrate 102, as illustrated in FIG. 4. In comparison with the charge-absorbing structure 130 being a single-layer as illustrated in FIGS. 1A-1E, 2, and 3, the semiconductor device 400 having the charge-absorbing structure 130 encapsulating the entire substrate 102 can be more helpful in reducing the scattering phenomenon of carrier, which enhances the reliability of the semiconductor device 400.

In some embodiments, the charge-absorbing structure 130 may be formed by a deposition process, such as a LPCVD process. Although the thickness of the vertical portion of the charge-absorbing structure 130 and the thickness of the horizontal portion are substantially the same as illustrated, the present disclosure is not limited thereto, and the thickness of the vertical portion may be larger or smaller than the thickness of the horizontal portion. In some embodiments, the thickness of the vertical portion of the charge-absorbing structure 130 and the thickness of the horizontal portion may each independently in a range from about 100 nm to about 1000 nm. For example, the vertical portion has a thickness of between 250 nm and 450 nm and the horizontal portion has a thickness of between 300 nm and 500 nm.

Furthermore, the buffer layer 132 may be disposed between the substrate 102 and the charge-absorbing structure 130 to relieve the lattice mismatch between the substrate 102 and the charge-absorbing structure 130, and to repair surface defects of the substrate 102. In addition, an additional buffer layer 134 may be disposed on the surface of the charge-absorbing structure 130 to relieve the lattice mismatch between the charge-absorbing structure 130 and other layers, and to repair surface defects of the charge-absorbing structure 130. The material and formation method of the buffer layer 134 may be selected from the material and formation method of the buffer layer 132, but other materials and formation methods may also be used. It should be noted that the semiconductor device 400 having both of the buffer layer 132 and the buffer layer 134 is merely illustrative and not limiting. For example, only one of the buffer layer 132 and the buffer layer 134 may be disposed.

According to some embodiments, the semiconductor device 500 includes a pair of additional charge-absorbing structures 136 that pass through the insulating layer 104 to contact the charge-absorbing structure 130, as illustrated in FIG. 5. The material of the charge-absorbing structure 136 may be selected from the materials of the charge-absorbing structure 130, but other materials may also be used. In some embodiments, the width of each charge-absorbing structure 136 may be in a range from about 0.5 µm to about 2 µm, such as from about 1 µm to about 1.5 µm.

According to some embodiments, a pair of isolation structures 138 is disposed on both sides of the first doped region 112 (refer to FIGS. 1A-1E and 2) and the second doped region 120 which are alternately arranged, as illustrated in FIG. 5. In some embodiments, the pair of isolation structures 138 may include a dielectric material such as silicon oxide, silicon nitride, silicon oxynitride, the like, or a combination thereof. The pair of isolation structures 138 may be a shallow trench isolation (STI) structure. In some embodiments, a mask layer (not illustrated) may be provided to expose a predetermined position of the pair of isolation structures 138, and the semiconductor layer 106 (refer to FIGS. 1A-1E and 2) may be etched to form trenches (not illustrated) by an etching process. An isolation material is then deposited in the trenches by a deposition process to form the pair of isolation structures 138. The material and formation of the mask layer are as described above and will not be described again. As illustrated in FIG. 5, the charge-absorbing structure 136 pass through the isolation structure 138.

According to some embodiments, a dielectric layer 140 is disposed over the semiconductor layer 106, as illustrated in FIG. 5. In some embodiments, the dielectric layer 140 may include a dielectric material such as silicon oxide, silicon nitride, silicon oxynitride, the like, or a combination thereof, and the dielectric layer 140 may be formed by a deposition process, such as PVD process, a CVD process, an ALD process, a spin-on glass process, a flowable chemical vapor deposition (FCVD), the like, or a combination thereof.

According to some embodiments, interconnect structures 142, 144, and 146 are formed through the dielectric layer 140 to electrically connect the source 122, the gate electrode 128, and the drain 124, respectively, as illustrated in FIG. 5. In some embodiments, the material of the interconnect structures 142, 144, and 146 may include a conductive material, such as a metal, a metal nitride, a metal oxide, a metal silicide, a semiconductor material, the like, or a combination thereof. In some embodiments, a mask layer (not illustrated) may be formed over the dielectric layer 140 to expose predetermined position of the interconnect structures 142, 144, and 146, and the dielectric layer 140 is etched to form trenches (not illustrated) by an etching process, then a conductive material is deposited in the trenches by a deposition process to form the interconnect structures 142, 144, and 146. The material and formation of the mask layer are as described above and will not be described again.

In some embodiments, the trenches used to form the interconnect structures 142, 144, and 146 and the trenches used to form the charge-absorbing structure 136 may be simultaneously etched by a single patterning process, but the present disclosure is not limited thereto. In other embodiments, the trenches for forming the interconnect structures 142, 144, and 146 and the trenches for forming the charge-absorbing structure 136 may be separately etched by different patterning processes, and the charge-absorbing structures 136 may be formed before or after the formation of the interconnect structures 142, 144, and 146.

Since the first doped regions 112 (refer to FIGS. 1A-1E and 2) and the second doped region 120 which are alternately arranged are located between the pair of charge-absorbing structures 136, compared to the charge-absorbing structure 130 which is a single-layer as illustrated in FIGS. 1A-1E and 2 and the charge-absorbing structure 130 encapsulating the substrate 102 as illustrated in FIG. 4, and the semiconductor device 500 can more effectively reduce the scattering phenomenon of carrier, and enhance reliability of the semiconductor device 500.

According to some embodiments, the present disclosure forms a semiconductor device having a super junction structure by using an ion implantation process with a mask layer and a field oxide, the ion implantation region can be precisely controlled through a self-alignment method when forming the first doped region and the second doped region which are alternately arranged to avoid an offset region due to photolithography shift, thereby improving the yield of the semiconductor device. In addition, due to the precision of the method, the breakdown voltage and the on-resistance can be optimized while reducing the channel length of the semiconductor device, and thus it is particularly suitable for a semiconductor device having a SOI substrate.

In addition, according to some embodiments of the present disclosure, a charge-absorbing structure is disposed on a semiconductor device to reduce scattering phenomenon of carrier when the SOI substrate is applied to high frequency operation, thereby improving reliability of the semiconductor device.

While the present disclosure has been described above by various embodiments, these embodiments are not intended to limit the disclosure. Those skilled in the art should appreciate that they may make various changes, substitutions and alterations based on the embodiments of the present disclosure to realize the same purposes and/or advantages as the various embodiments described herein. Those skilled in the art should also appreciate that such design or modification practiced does not depart from the spirit and scope of the disclosure. Therefore, the scope of protection of the present disclosure is defined as the subject matter set forth in the appended claims.

What is claimed is:

1. A semiconductor device, comprising:
a charge-absorbing structure disposed over a substrate;
an insulating layer disposed over the charge-absorbing structure;
a pair of additional charge-absorbing structures passing through the insulating layer to contact the charge-absorbing structure;
a semiconductor layer disposed over the insulating layer;
a plurality of first doped regions and a plurality of second doped regions disposed in the semiconductor layer, wherein the plurality of first doped regions and the plurality of second doped regions extend in a first direction and are alternately arranged along a second direction that is different than the first direction, and the plurality of first doped regions and the plurality of second doped regions have different conductivity types;
a source and a drain disposed respectively on opposite sides of the plurality of first doped regions and the plurality of second doped regions which are alternately arranged and the source and the drain extend in the second direction; and
a gate disposed on the plurality of first doped regions and the plurality of second doped regions which are alternately arranged and the gate extends in the second direction.

2. The semiconductor device as claimed in claim 1, wherein the charge-absorbing structure comprises polycrystalline silicon.

3. The semiconductor device as claimed in claim 1, wherein a thickness of the charge-absorbing structure is in a range from 100 nm to 1000 nm.

4. The semiconductor device as claimed in claim 1, further comprising a buffer layer encapsulating the entire substrate.

5. The semiconductor device as claimed in claim 4, wherein the buffer layer comprises an oxide, a nitride, or a combination thereof.

6. The semiconductor device as claimed in claim 4, wherein the charge-absorbing structure encapsulates the entire substrate and the buffer layer encapsulates the charge-absorbing structure.

7. The semiconductor device as claimed in claim 4, wherein the charge-absorbing structure encapsulates the entire substrate and the buffer layer is located between the substrate and the charge-absorbing structure.

8. The semiconductor device as claimed in claim 7, further comprising an additional buffer layer encapsulating the charge-absorbing structure.

9. The semiconductor device as claimed in claim 1, wherein a width of each additional charge-absorbing structure is in a range from 0.5 μm to 2 μm.

10. A method for forming a semiconductor device as claim 1, comprising:
forming a charge-absorbing structure on a substrate;
forming an insulating layer over the charge-absorbing structure and a semiconductor layer over the insulating layer;
forming a pair of additional charge-absorbing structures which pass through the insulating layer to contact the charge-absorbing structure;
forming a mask layer having a plurality of openings over the semiconductor layer;
implanting a portion of the semiconductor layer through the plurality of openings to form a plurality of first doped regions having a first conductivity type, wherein the plurality of first doped regions extend in a first direction;
forming a plurality of field oxides through the plurality of openings to respectively cover the plurality of first doped regions;
after forming the plurality of field oxides, removing the mask layer;
implanting another portion of the semiconductor layer with the plurality of field oxides as masks to form a plurality of second doped regions having a second conductivity type that is different than the first conductivity type, wherein the second doped regions extend in the first direction and are alternately arranged with the first doped region along the second direction that is different than the first direction; and
after forming the plurality of second doped regions, removing the plurality of field oxides.

11. The method as claimed in claim 10, wherein a material of the plurality of field oxides is different than a material of the mask layer.

12. The method as claimed in claim 10, wherein a ratio of a thickness of the mask layer to a thickness of one of the field oxides is in a range from 5:1 to 10:1.

13. The method as claimed in claim 10, further comprising forming a source and a drain along the second direction on both sides of the first doped regions and the second doped regions which are alternately arranged, respectively; and
forming a gate on the semiconductor layer and along the second direction.

14. The method as claimed in claim 10, further comprising forming a buffer layer which encapsulates the entire substrate.

15. The method as claimed in claim 14, wherein forming the buffer layer includes depositing an oxide, a nitride, or a combination thereof.

16. The method as claimed in claim 14, wherein the charge-absorbing structure encapsulates the entire substrate and the buffer layer encapsulates the entire charge-absorbing structure.

17. The method as claimed in claim 14, wherein the charge-absorbing structure encapsulates the entire substrate, and a buffer layer is located between the charge-absorbing structure and the substrate.

18. The method as claimed in claim 17, further comprising forming an additional buffer layer which encapsulates the entire charge-absorbing structure.

* * * * *